(12) United States Patent
Verheijden et al.

(10) Patent No.: US 9,859,818 B2
(45) Date of Patent: Jan. 2, 2018

(54) MICRO-DEVICE WITH A CAVITY

(71) Applicant: Taiwan Semiconductor Manufacturing Company, Ltd., Hsin-Chu (TW)

(72) Inventors: Greja Johanna Adriana Maria Verheijden, Riethoven (NL); Roel Daamen, Herkenbosch (NL); Gerhard Koops, Aalst (BE)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 202 days.

(21) Appl. No.: 14/562,859

(22) Filed: Dec. 8, 2014

(65) Prior Publication Data

US 2015/0091411 A1 Apr. 2, 2015

Related U.S. Application Data

(62) Division of application No. 13/673,494, filed on Nov. 9, 2012, now Pat. No. 8,906,729, which is a division
(Continued)

(30) Foreign Application Priority Data

Apr. 23, 2008 (EP) ..................... 08103686

(51) Int. Cl.
*H01L 23/48* (2006.01)
*H01L 23/52* (2006.01)
(Continued)

(52) U.S. Cl.
CPC .......... *H02N 1/00* (2013.01); *B81C 1/00476* (2013.01); *H01L 21/02* (2013.01);
(Continued)

(58) Field of Classification Search
USPC .. 257/E21.271, E21.499, E23.145, E29.324, 257/758; 438/619, 51, 411, 50, 52, 743,
(Continued)

(56) References Cited

U.S. PATENT DOCUMENTS 6,127,812 A 10/2000 Ghezzo et al.
6,936,491 B2 8/2005 Partridge et al.
(Continued)

FOREIGN PATENT DOCUMENTS

EP 2325135 A1 5/2011
WO WO-2004-105122 A1 12/2004

OTHER PUBLICATIONS

Final Rejection of U.S. Appl. No. 13/673,494 dated Jun. 4, 2014.*
(Continued)

*Primary Examiner* — Telly Green
(74) *Attorney, Agent, or Firm* — Haynes and Boone, LLP

(57) ABSTRACT

A micro-device includes a substrate with a cavity. The cavity is covered with a porous layer that is permeable to vapor hydrofluoric acid (HF) etchant. The micro-device comprises a Microelectromechanical Systems (MEMS) device with a component that is moveable in operational use of the MEMS device. The component is arranged within the cavity.

19 Claims, 10 Drawing Sheets

Related U.S. Application Data of application No. 12/427,797, filed on Apr. 22, 2009, now Pat. No. 8,310,053.

(51) Int. Cl.

| | | |
|---|---|---|
| *H01L 29/40* | (2006.01) | |
| *H02N 1/00* | (2006.01) | |
| *H01L 21/311* | (2006.01) | |
| *H01L 21/02* | (2006.01) | |
| *B81C 1/00* | (2006.01) | |
| *H01L 21/50* | (2006.01) | |
| *H01L 29/84* | (2006.01) | |
| *H01L 21/768* | (2006.01) | |

(52) U.S. Cl.
CPC .. *H01L 21/02126* (2013.01); *H01L 21/31116* (2013.01); *H01L 21/50* (2013.01); *H01L 21/7688* (2013.01); *H01L 29/84* (2013.01)

(58) Field of Classification Search
USPC .......................................................... 438/756
See application file for complete search history.

(56) References Cited

U.S. PATENT DOCUMENTS

| | | | |
|---|---|---|---|
| 6,936,902 | B2 | 8/2005 | Reichenbach et al. |
| 7,037,851 | B2 | 5/2006 | Gueneau de Mussy et al. |
| 7,294,934 | B2 | 11/2007 | Kloster et al. |
| 7,960,275 | B2 | 6/2011 | Gaillard |
| 2003/0155657 | A1* | 8/2003 | Tonegawa ......... H01L 21/32051 257/774 |
| 2005/0067702 | A1* | 3/2005 | America ........... H01L 21/02126 257/753 |
| 2007/0178713 | A1* | 8/2007 | Jeng ................. H01L 21/76814 438/787 |
| 2008/0038934 | A1* | 2/2008 | Vrtis ................ H01L 21/02115 438/759 |
| 2013/0069178 | A1 | 3/2013 | Verheijden |

OTHER PUBLICATIONS

C.R. Helms and B.E. Deal, "Mechanisms of the HF/H20 Vapor Phase Etching of SiO2," Jul./Aug. 1992, pp. 806-811, J. Vac. Sci. Technol. A 10(4).

\* cited by examiner

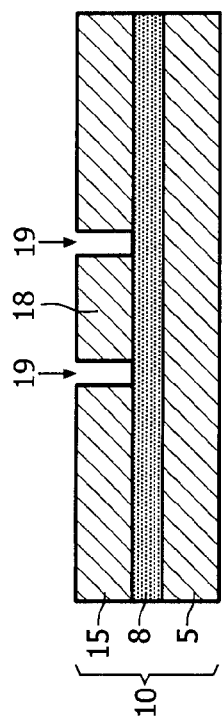
FIG. 1a
FIG. 1b
FIG. 1c
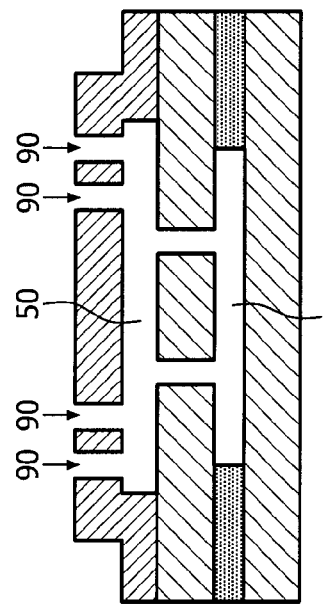
FIG. 1d
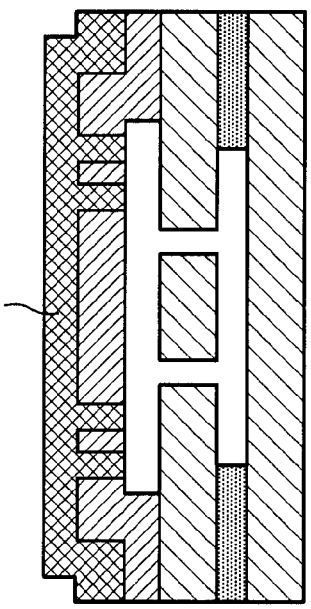
FIG. 1e
Prior art

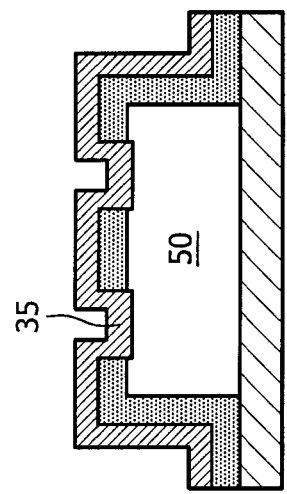
FIG. 4a2
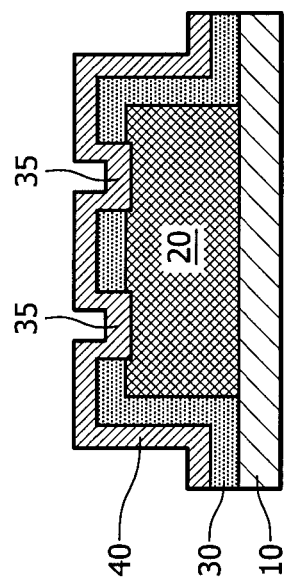
FIG. 4a1
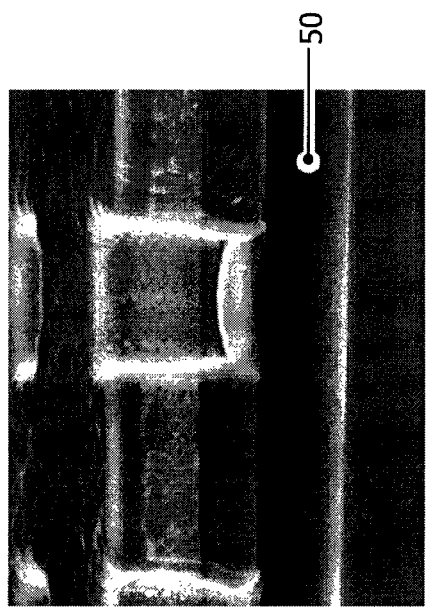
FIG. 4b

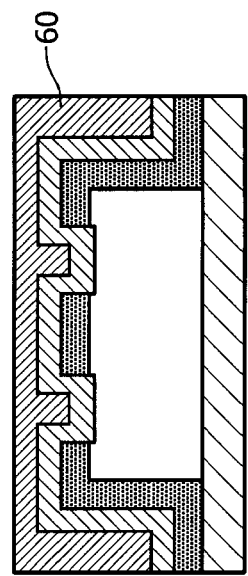
FIG. 5a1
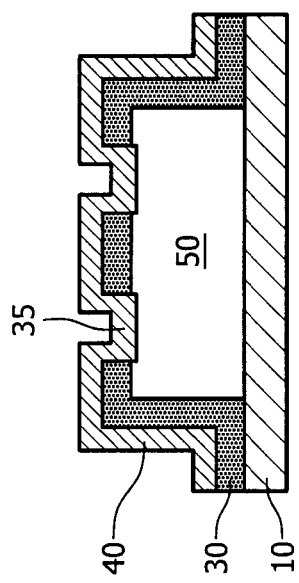
FIG. 5a2
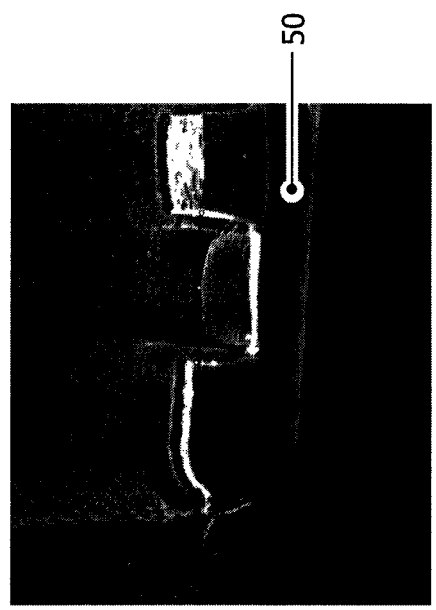
FIG. 5b

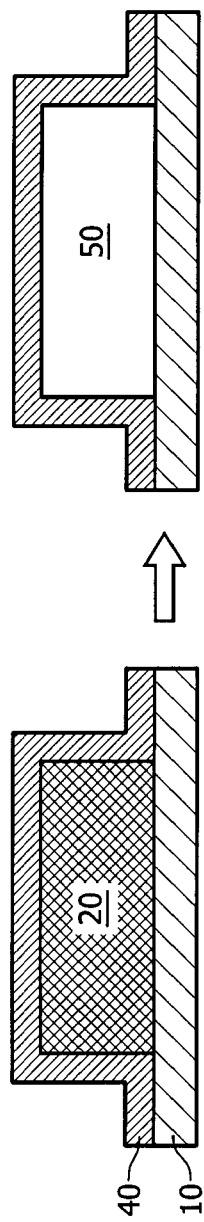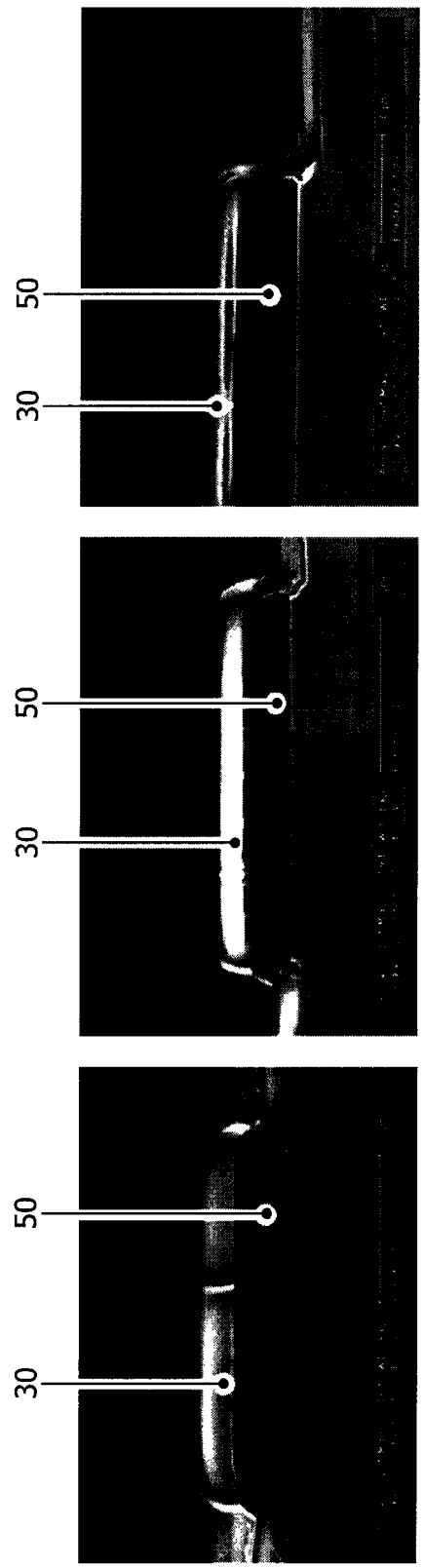
FIG. 6a1   FIG. 6a2
FIG. 6b  700nm BD
FIG. 6c  500nm BD
FIG. 6d  300nm BD

MICRO-DEVICE WITH A CAVITY

CROSS REFERENCE

This application is a divisional of U.S. Ser. No. 13/673,494 filed Nov. 9, 2012, and entitled "Method of Manufacturing a Device with a Cavity," which is a divisional of U.S. Ser. No. 12/427,797 filed Apr. 22, 2009, and entitled, "Method of Manufacturing a Device with a Cavity," the disclosures of which are hereby incorporated by reference in the entirety. This application also claims priority to European patent application number 08103686.5, filed Apr. 23, 2008, the disclosures of which is incorporated herein by reference.

FIELD OF THE INVENTION

The invention relates to a method of manufacturing a micro-device with a cavity. The invention further relates to such micro-device with a cavity, and in particular to a MEMS device or a semiconductor device.

BACKGROUND OF THE INVENTION

Various types of micro-devices with a cavity exist. A first class of such micro-devices consists of micro-electromechanical system (MEMS) devices. Such devices generally comprise a moveable element that is controlled by electrostatic or piezo-electric forces, i.e. a resonator or moveable electrode. In order to allow the element to be moveable such element is preferably arranged within a cavity.

A second class of such micro-devices consists of semiconductor devices having at least one interconnect layer. In order to reduce parasitic capacitances of this on-chip interconnect a trend towards low-k dielectrics is observed in deep-submicron process technologies. The ultimate goal for the manufacturing of low-k dielectrics is to create on-chip interconnect without dielectric material around it. Air has a dielectric constant which is very close to vacuum, i.e. slightly above 1. Because of mechanical reasons such technologies are not yet feasible, but as an intermediate solution technologies have been reported wherein cavities, also being referred to as air-gaps, are present in the interconnect layers.

Various methods of manufacturing micro-devices with a cavity have been reported. One such method is known from WO2004/105122 A1 and consists of obtaining a dual damascene structure, applying a diffusion barrier layer directly on the planarized surface and performing a lithography step, thus shielding the metal lines underneath the diffusion barrier layer. Optionally, some portions of large dielectric areas between the metal lines are also shielded. The exposed diffusion barrier layer portions and underlying dielectric are etched. A layer of a material that can be decomposed in volatile components by heating to a temperature of typically between 150-450° C. is applied, and planarized by etching or CMP. A dielectric layer that is permeable to the decomposition products is deposited and subsequently the substrate is heated. Then, the disposable layer decomposes and disappears through the permeable dielectric layer, leaving air gaps behind in between the metal lines and the large dielectric areas.

A problem with the known method of manufacturing a micro device with a cavity is that the method requires, in particular in the step of decomposing the sacrificial layer, relatively high temperatures (150-450° C.) which makes the method less compatible with back-end-of-line (BEOL) processing. This decomposing temperature limits the processing after deposition. In subsequent processing steps the temperature must stay below the decomposition temperature. And the decomposing temperature should also stay below BEOL temperatures. If a material is selected with a higher decomposition temperature, i.e. above 450° C., then the decomposition is not BEOL compatible any more.

SUMMARY OF THE INVENTION

It is an object of the invention to provide a method of manufacturing a micro-device with a cavity that requires lower temperatures, and that is therefore more BEOL-processing compatible.

The invention is defined by the independent claims. The dependent claims define advantageous embodiments.

In a first aspect, the invention relates to a method of manufacturing a micro-device with a cavity, the micro-device comprising a substrate, the method comprising steps of:

providing the substrate having a surface and comprising a sacrificial oxide region at the surface;

covering the sacrificial oxide region with a porous layer being permeable to a vapor HF etchant, and selectively etching the sacrificial oxide region through the porous layer using the vapor HF etchant to obtain the cavity.

The effect of the features of the method in accordance with the invention is that no high temperature steps are needed anymore. The inventors have realized that some materials are permeable, or may be made permeable, to vapor HF etchant and the etch products and are substantially left intact by that etchant. Vapor HF etching may be done at relatively low temperatures, i.e. 35° C., leaving a higher temperature budget for other processing steps which may be done in between. Also the deposition of the porous layer is done at relatively low temperatures. This renders the method more compatible with BEOL processing wherein temperatures are preferably kept well below 450° C. In the method it is important that a material is selected that is not etched, or substantially left in tact, by vapor-HF and that is porous enough to remove the "sacrificial" oxide underneath the porous layer by the vapor HF etchant and also permeable for the etch products. The inventors have realized that this combination of features can be used for creating a cavity underneath the porous layer.

The method of the invention may be applied in various very different application areas. By way of a first example, it may be applied in the manufacturing of air-gaps in the interconnect layers of a semiconductor device, and, by way of a second example, in the manufacture of a MEMS device, and in particular in the encapsulation stage thereof. Nevertheless, the method may be applied in various other application areas. In those application areas, the inventive concept is the same, namely the forming of a cavity by selectively etching a sacrificial oxide region through a porous layer that is permeable to vapor HF etchant.

In an embodiment of the method in accordance with the invention the porous layer comprises carbon-doped oxide. This material has been identified by the inventors as a class of materials that is permeable to vapor HF etchant. Carbon-doped oxides are also being referred to as organo-silicate glass (OSG).

In an embodiment of the method in accordance with the invention the porous layer comprises non-densified Black-Diamond™ material or non-densified Aurora™ material. Black Diamond™ is a dielectric material that may be bought from Applied Materials Inc. The process flow which is provided together with Black Diamond™ includes, after the deposition step, a plasma treatment step in which a plasma is used to seal the porous (dielectric) layer. In the case of Black Diamond™ a Helium plasma is used. During the plasma treatment a thin (i.e. between 20 nm and 30 nm) densified layer is formed at the surface of the porous layer. The inventors have realized that when this step is left out from the process flow a layer is obtained that is fully permeable to vapor HF etchant. Also, in the Black Diamond™ process flow as provided by Applied Materials the first step is to provide an $O_2$ plasma to have a better adhesion (so before depositing the Black-Diamond layer). This step is also skipped in the method according to the invention, because this creates an oxidized layer underneath the Black Diamond that can cause delamination of this Black Diamond layer during the release etch. Similar to Black Diamond™ also Aurora™ material may be used. These materials have a very similar chemical structure. In the Aurora process flow also a sealing/densification step is performed, which in the method according to the invention can be skipped.

In an embodiment of the method in accordance with the invention the sacrificial oxide region comprises silicon oxide. Silicon oxide provides for a large etch rate and is compatible with conventional CMOS process technologies.

An embodiment of the method in accordance with the invention is characterized in that the micro-device comprises a MEMS device with a component that is moveable in operational use of the MEMS device, and in that in the step of providing the substrate, the substrate comprises the MEMS device with an element; the element being embedded between the sacrificial oxide region at the surface and a further sacrificial oxide region in contact with the sacrificial oxide region; and in the step of selectively etching, both the sacrificial oxide region and the further sacrificial oxide region are selectively etched for forming the cavity around the element for releasing the element so as to obtain the component. The method in accordance with the invention is advantageously applied in the manufacture of MEMS devices, and in particular in the encapsulation stage thereof. In this embodiment the lower temperature of the process in accordance with the invention, leads to a higher compatibility with BEOL processing. Also, the method renders the need for etching holes in the porous layer superfluous (which is done in other known methods). This saves a masking step and thus costs. An additional advantage in the manufacture of MEMS device is that the porous layer makes it much easier to seal the cavity. The porous layer prevents deposition of sealing material in the cavity (and on the moveable component).

An embodiment of the method in accordance with the invention the method is characterized in that:

between the step of providing the substrate and the step of covering the sacrificial oxide region, a first step of covering the substrate with a packaging cap layer for forming an encapsulation shell for the MEMS device, and a second step of patterning the packaging cap layer for forming a release hole in the packaging cap layer extending to the sacrificial oxide region, and in that in the step of covering the sacrificial region, the porous layer is also provided so as to cover the release hole, and in that in the step of selectively etching, the etching occurs through the porous layer which is located in the release hole. This embodiment of the method looks more like the conventional method, because it makes use of the packaging cap layer, which is used in the conventional methods too. The use of the packaging cap layer provides for a better mechanical strength/stability of the structure (i.e. the packaging cap layer is much stronger than the porous layer). The porous layer may be provided on a wall or on the walls of the release hole or maybe covering the release hole as a lid.

An embodiment of the method in accordance with the invention comprises, after the step of selectively etching, a sealing step comprising sealing the porous layer. In certain applications it may be desired to make a vacuum in the cavity. If the method is carried out in vacuum until after sealing the porous layer, the vacuum in the cavity is maintained.

In an embodiment of the method in accordance with the invention the sealing step comprises covering the porous layer with a sealing layer. Providing a sealing layer on the porous layer leads to a structure with a higher mechanical strength and stability. Also, the deposition environment will be the environment in the cavity, so if the MEMS device needs a certain vacuum level you have to make sure that the deposition of the seal layer is in vacuum.

In an embodiment of the method in accordance with the invention the sealing layer comprises a material selected from the group comprising: silicon-germanium (SiGe), silicon dioxide ($SiO_2$), silicon nitride ($Si_3N_4$), silicon carbide (SiC), aluminum (Al), titanium-nitride (TiN), tantalum (Ta), and all other materials known BEOL deposition processes (CVD/PECVD or PVD layers).

An embodiment of the method in accordance with the invention is characterized in that the micro-device comprises a semiconductor device with a first interconnect layer, and in that in the step of providing the substrate, the substrate comprises the first interconnect layer, the first interconnect layer comprising the sacrificial oxide region at the surface, and in that in the step of selectively etching, the cavity in the first interconnect layer is obtained for forming an air gap. The method in accordance with the invention is advantageously applied in the manufacture of semiconductor devices, and in particular in the back-end-of-line (BEOL) stage thereof. In this embodiment the lower temperature of the process in accordance with the invention, leads to a higher compatibility with BEOL processing. Also, this embodiment of the method renders the use of hard mask layers superfluous. Hard mask layers generally have a higher dielectric constant. Consequently, this embodiment of the method provides for a semiconductor device having interconnect with a lower effective dielectric constant, and thus a lower parasitic capacitance. This will be elaborated on in more detail in the Figure description. It must be noted that this embodiment of the method may be combined with the embodiment in which a MEMS device is manufactured. This is because the invention provides a method which is BEOL compatible due to its lower temperatures. The respective cavity for the MEMS device and the respective cavity for the semiconductor device may be manufactured simultaneously (using the same selective etching step) or after each other.

An embodiment of the method in accordance with the invention is characterized in that:

in the step of providing the substrate, the substrate comprises a second interconnect layer, wherein the second interconnect layer comprises a second sacrificial oxide layer, wherein first and the second sacrificial oxide layers are separated by a second porous layer being permeable to a vapor HF etchant, and in that in the step of selectively etching, the first cavity in the first interconnect layer and a second cavity in the second interconnect layer are obtained for forming airgaps. This method results in a semiconductor device having multiple interconnect layers, which provides for more routing resources and higher packing densities. The advantages of the method in accordance with the invention are significant. First of all, all airgaps are formed in the last BEOL step, which ensures a higher structural integrity during back-end processing. Furthermore, the airgaps are formed in a single etch step which reduces the number of processing steps.

In a second aspect the invention relates to micro-device, manufactured with a method comprising photolithographic processing, comprising a substrate with a cavity, wherein the cavity is covered with a porous layer that is permeable to vapor HF etchant. The advantages of the micro-device and its embodiments follow that of the corresponding method of manufacturing.

In a first main group of embodiments of the micro-device in accordance with the invention, the micro-device comprises a MEMS device with a component that is moveable in operational use of the MEMS device, wherein the component is arranged within the cavity.

An embodiment of the micro-device in accordance with the invention further comprises a patterned packaging cap layer with a release hole extending to the cavity the porous layer has been provided on the packaging cap layer and in the release hole.

In this embodiment the porous layer closes the cavity (together with the patterned packaging cap layer.

In an embodiment of the micro-device in accordance with the invention the porous layer has been sealed.

In an embodiment of the micro-device in accordance with the invention the porous layer has been covered with a sealing layer.

In an embodiment of the micro-device in accordance with the invention the sealing layer comprises a material selected from the group comprising: silicon-germanium (SiGe), silicon dioxide ($SiO_2$), silicon nitride ($Si_3N_4$), silicon carbide (SiC), aluminum (Al), titanium-nitride (TiN), tantalum (Ta), and all other materials known BEOL deposition processes (CVD/PECVD or PVD layers).

In a second main group of embodiments of the micro-device in accordance with the invention, the micro-device comprises a semiconductor device with a first interconnect layer, wherein the first interconnect layer comprises the cavity for reducing parasitic interconnect capacitance, the cavity being covered by the porous layer being permeable to vapor HF etchant.

In an embodiment of the micro-device in accordance with the invention the cavity is provided at a trench level of the interconnect layer. In another embodiment of the micro-device in accordance with the invention the cavity is provided at a via-level of the interconnect layer. In any case, the cavity is located there were the sacrificial oxide region was located.

In an embodiment of the micro-device in accordance with the invention a second interconnect layer, wherein the first interconnect layer and the second interconnect layer are separated by a further porous layer being permeable to vapor HF etchant.

These and other aspects of the invention are apparent from and will be elucidated with reference to the embodiments described hereinafter.

BRIEF DESCRIPTION OF THE DRAWINGS

In the drawings:

FIGS. 1a to 1e schematically show an encapsulation process of a MEMS device as known from the prior art;

FIGS. 4a1 and 4a2 schematically show an etching step carried out between two process stages of a first experiment proving the feasibility of the first embodiment of the method of the invention;

FIG. 4b shows a cross-section SEM picture of the device of FIG. 4a2;

FIGS. 5a1 and 5a2 schematically show a sealing step carried out between further process stages of the first experiment proving the feasibility of the first embodiment of the method of the invention;

FIG. 5b shows a cross-section SEM picture of the device of FIG. 5a2;

FIGS. 6a1 and 6a2 schematically show an etching step carried out between two process stages of a first experiment proving the feasibility of the second embodiment of the method of the invention;

FIGS. 6b to 6d show cross-section SEM pictures of devices in accordance with FIG. 6a2 for different porous layer thicknesses.

DETAILED DESCRIPTION OF THE PREFERRED EMBODIMENT

Figure 2A:
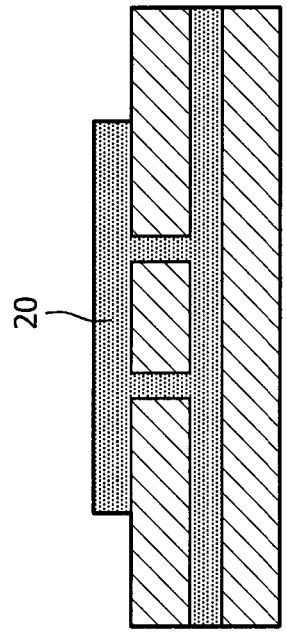
FIGS. 2a to 2f schematically show an encapsulation process of a MEMS device in accordance with a first embodiment of the method of the invention.
Figure 2B:
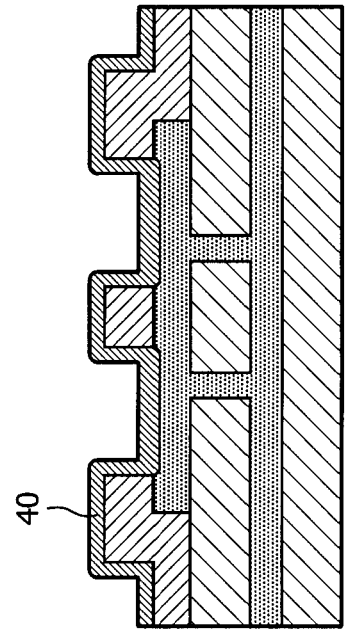
Figure 2C:
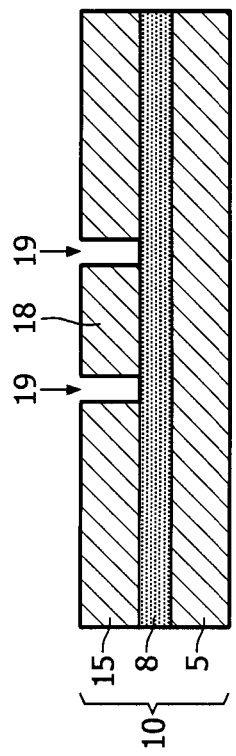

The invention relates to the manufacturing of a micro-device with a cavity, and to such a micro-device itself. The description focuses on two application areas, MEMS devices and semiconductor devices. In MEMS devices the cavity is situated around a moveable element, and has the function of allowing the moveable component to move in operation. In semiconductor devices, cavities are situated near interconnect in order to reduce parasitic capacitances. In this application area cavities in the interconnect layers are also being referred to as air-gaps.

Throughout this description the term "interconnect layer" should be considered as synonym to "metallization layer" or "metal layer". Both terms are used interchangeably and have to be interpreted as the layer comprising conductors, the insulating layer in which the conductors are embedded, and any vias (=contacts) to underlying layers. These terms are well-known to the person skilled in the art of semiconductor technology.

Throughout this description the term substrate should be interpreted broadly. The substrate may comprise at its frontside elements, e.g. transistors, capacitors, resistors, diodes, and inductors, which form the components of an electronic circuit. The substrate may further comprise interconnections between the elements which may be laid out in one or more interconnect layers. In the Figures, the elements have been left out in order to facilitate the understanding of the invention.

Where in this description the word "MEMS" (micro-electromechanical systems) is used, this should also be construed to include NEMS (nano-electromechanical systems). Wherein this description the word deep-submicron process technology is used, this should also be construed to include nanotechnology.

In this description in semiconductor devices different dielectric layers are mentioned. A first dielectric is located between interconnects in the same interconnect layer. This dielectric is also called intra-metal dielectric (IMD) or trench-level dielectric. A second dielectric is located between interconnects in different interconnect layers, which is also called inter-layer dielectric (ILD) or via-level dielectric.

In this description reference is made to a process step called vapor HF etching. This technique is considered as known to the person skilled in the art. More information can be found in various disclosures, for example in:

C. R. Helms, and B. E. Deal, "*Mechanisms of the HF/$H_2O$ vapor phase etching of $SiO_2$*", J. Vac. Sci. Technol. A 10(4), July/August 1992.

A MEMS device has to be protected during dicing and molding. One method to do this is by wafer level packaging. This means that standard micro machined techniques for the encapsulation of the MEMS device are being used. A big advance of this technique over others is the cost affectivity and the small device footprint. FIGS. 1a to 1e schematically show an encapsulation process of a MEMS device as known from the prior art.

In the step of FIG. 1a a substantially completed MEMS device (for example a resonator) is provided. The MEMS device comprises a body 10 which comprises a substrate 5, a buried sacrificial oxide layer 8 provided on the substrate 5, and a device layer 15 in which an element 18 has been formed which, when in operational use, must be moveable. The element 18 has been defined in the device layer 15 by means of trenches 19 which expose the underlying buried sacrificial oxide layer 8. At certain locations the trenches are interrupted in order to define anchors to the element 18. These anchors (not shown) have the function as resilient springs for suspending the element 18 in the body 10.

The substrate 5 may be of any kind, including semiconductor substrates and the buried oxide layer 8 may be silicon oxide for example. Also, the substrate 5 may comprise active devices like transistors and diodes (not shown). The device layer 15 may comprise semiconductor material, and also other elements (left out for clarity reasons).

In the step of FIG. 1b a further sacrificial oxide layer 20 is provided such that it covers the element 18 and fills the trenches 19. The step may be done by fully covering the MEMS device with the sacrificial oxide layer 20 and then patterning the layer 20 using conventional lithographic processing. The further sacrificial oxide layer 20 may be silicon oxide for example. Whereas, in this embodiment the trenches are filled with the further sacrificial oxide layer this is not necessary, as long as they are not filled with material that would not be etched away with vapor HF etchant.

In the step of FIG. 1c, a packaging cap layer 30 is deposited on the MEMS device for the formation of the encapsulation shell of the device, and subsequently the layer 30 is patterned to form release holes 31 that extend to the underlying further sacrificial oxide layer 20. The packaging cap layer may comprise materials like: SiC, $Si_3N_4$ SiGe, and Poly-Si (not $SiO_2$). Patterning of the packaging cap layer 30 may be done by means of patterning (lithography followed by etching) which is well known to the person skilled in the art.

In the step of FIG. 1d, both the buried sacrificial oxide layer 8 and the further sacrificial oxide layer 20 are selectively removed by selective etching using an etching chemistry 90, for example a liquid hydrogen-fluoride (HF) solution or a vapor HF etchant in case silicon oxide is used as sacrificial material.

Selective etching is a technique which is well known to the person skilled in the art. During the selective etching step, which takes place through the release holes 31, the sacrificial oxide material is removed which leaves a cavity 50 around the element 18 releasing the mechanical micro structure. Expressed differently, the element 18 now becomes a moveable component. In the Figure it seems as if the component 18 is floating, but in practice there are anchors (not shown) keeping the component in place. Preferably, the buried sacrificial oxide layer 8 and the sacrificial oxide layer 20 are of the same material, which makes it easier to remove both layers in the same etching step.

In the step of FIG. 1e the release holes 31 are sealed by depositing a seal layer 60. The seal layer 60 may comprise materials like: silicon-germanium (SiGe), silicon dioxide ($SiO_2$), silicon nitride ($Si_3N_4$), silicon carbide (SiC), aluminum (Al), titanium-nitride (TiN), tantalum (Ta), and all other materials known BEOL deposition processes (CVD/PECVD or PVD layers). There is a very important design constraint in the encapsulation method of MEMS devices of this kind. The most difficult step in the wafer encapsulation process is the sealing of the releasing holes. The resonator/MEMS device is sensitive for impurities, so the seal layer 60 has to be deposited without leaving impurities inside. The release holes 31 may not be too large and may not be located above the moveable component 18, because otherwise material from the seal layer 60 may fall onto the moveable component 18 which is detrimental for the performance of the device. If a vacuum is needed within the cavity the deposition pressure must be low enough.

The inventors have realized that back-end of line (BEOL) compatible process-temperatures (below 450° C.) would be a big asset for this method. This has as advantage that the resonator can be integrated with a CMOS-device on one chip and that the encapsulation of the resonator can be the last step and will not interfere with the CMOS processing. Both problems will be overcome by using a the method in accordance with the invention as illustrated in FIGS. 2a to 2f.

FIGS. 2a to 2f schematically show an encapsulation process of a MEMS device in accordance with a first embodiment of the method of the invention. This process will be discussed in as far as it differs from the known process illustrated in FIGS. 1a to 1e. The first two steps (FIGS. 2a and 2b) are the same as the first two steps of the known process. The third step, illustrated in FIG. 2c differs from the third step of the known method in that the release holes 31' in the packaging cap layer 30 may be designed much larger and may also be located above the moveable component 18. In the step of FIG. 2a, if the sacrificial oxide layer 8 is not an oxide it has to be removed before the sacrificial oxide layer 20 is deposited, because it will have to be removed together with the sacrificial oxide layer 20.

Figure 2D:
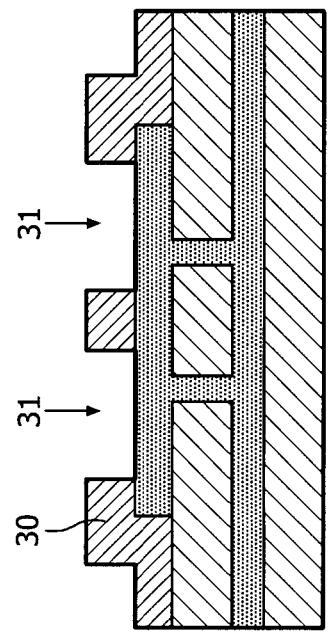
Figure 2F:
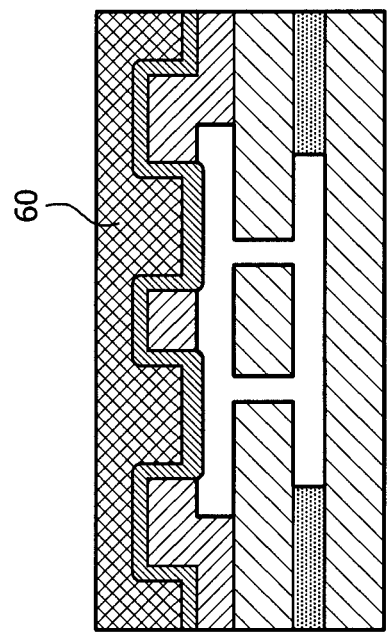

The step of FIG. 2d is new. In this step a porous layer 40 is deposited on the packaging cap layer 30 and in the release holes. The inventors have discovered that the material of the porous layer 40 may be selected such that the layer 40 is permeable to vapor HF etchant. Carbon-doped oxides are known to have this property, but there may be more classes. Within the carbon-doped oxide group the inventors have discovered that both non-densified Black-Diamond™ material (BD) or non-densified Aurora™ material (AU) may be used. It must be noted that the process flows which are provided by the manufacturers of these materials do not automatically lead to material being permeable to vapor HF etchant. Earlier in this description it has already been described that plasma treatments must be skipped. The deposition of the native materials is enough. If the last treatment (He-plasma) is done the accomplished densified layer will be removed by vapor-HF.

Figure 2E:
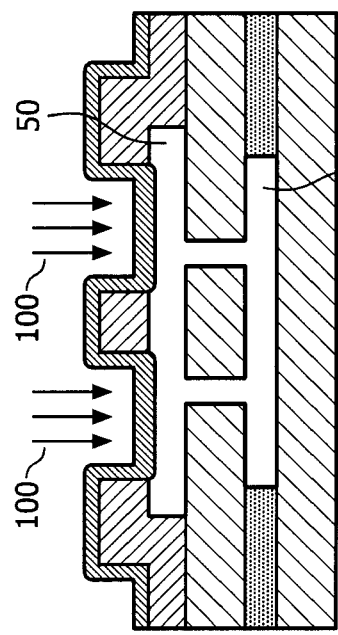
Figure 3A:
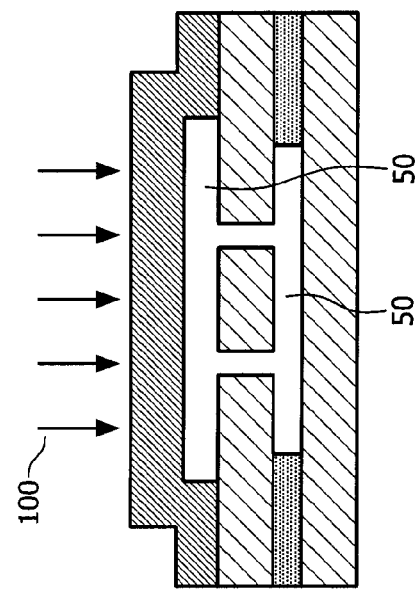
FIGS. 3a to 3e schematically show an encapsulation process of a MEMS device in accordance with a second embodiment of the method of the invention.
Figure 3B:
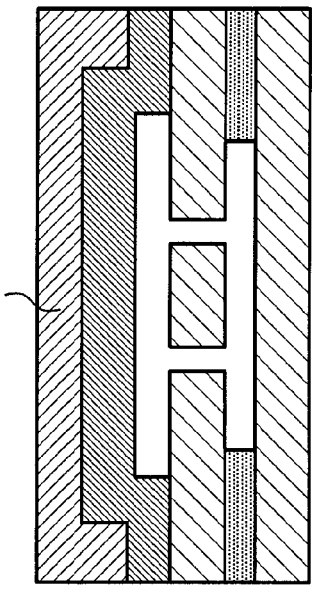
Figure 3C:
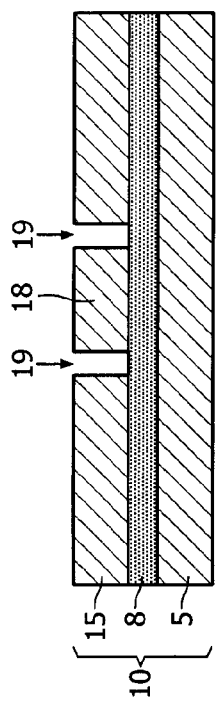
Figure 3D:
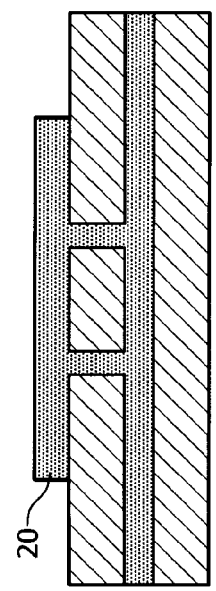
Figure 3E:
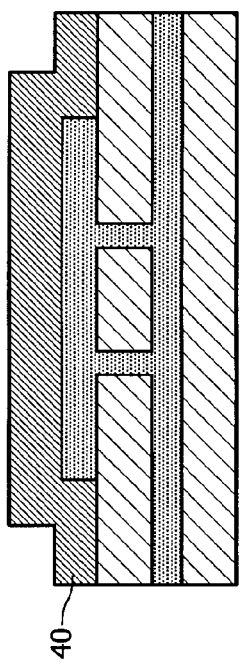

The step of FIG. 2e differs from the step in FIG. 1d in that instead of liquid HF etchant, vapor HF etchant 100 is used. Vapor HF etching as such is known to the person skilled in the art. Nevertheless, the inventive idea of the invention is to use vapor HF etchant 100 to selectively remove a sacrificial oxide layer through a porous layer that is permeable to vapor HF etchant 100.

The step of FIG. 1f differs from the step in FIG. 1e in that the sealing layer 60 is now provided on the porous layer 40. It is optional to provide a plasma treatment before deposition of the sealing layer 60.

The main advantages of the method of FIG. 2 are:
The BD material or AU material may be deposited with a back-end compatible temperature (i.e. 350° C. for BD), and
The porous layer 40 "pre-seals" the releasing hole 31' before the sacrificial layers 20, 8 are removed. Both BD and AU are porous enough to enable removal of the sacrificial oxide layer (with vapor HF etchant 100) but still avoid the deposition of seal-layer impurities inside the cavity. Another advantage of the BD and AU are insulators and therefore do not electrically interfere with the MEMS device (resonator). A further improvement may be obtained if a plasma treatment is performed before the sealing layer is provided. If the product gasses used during the deposition of the sealing layer are small enough to travel through the Black Diamond™ or Aurora™ layer, the top of the Black Diamond™ layer may be densified by a plasma (for example a Helium plasma) prior to the deposition of the sealing layer.

FIGS. 3a to 3e schematically show an encapsulation process of a MEMS device in accordance with a second embodiment of the method of the invention. This process will be discussed in as far as it differs from the first embodiment of the method in accordance with the invention as illustrated in FIGS. 2a to 2f. As a matter of fact the difference between the first embodiment and the second embodiment is that the step of providing a patterned packaging cap layer 30 (FIG. 2) with release holes 31 (FIG. 2) is completely omitted. Instead in FIG. 3c the porous layer 40 is provided (deposited) directly on the further sacrificial oxide layer 20. In order to ensure mechanical stability the porous layer 40 may need to be thicker than in the first embodiment of the method. However, thicker layers, while being mechanically stronger, may also have more internal stress. With the method as illustrated in FIGS. 2a to 2f it may be easier to choose for the packaging cap layer a material which is strong and has less stress. Contrary to other known methods reported in the prior art, there is no need to create holes for selectively etching the sacrificial oxide layer. Moreover, no packaging cap layer material is needed. Both aspects make the method of FIG. 3 need less process steps and in particular less masking steps. Cheaper devices may be manufactured.

In both the first embodiment (FIG. 2) and the second embodiment (FIG. 3) of the method in accordance with the invention, the last sealing step may be done by performing a plasma treatment. Such a plasma treatment densifies and seals the material at the surface of the porous layer 40.

FIGS. 4a1 and 4a2 schematically show an etching step carried out between two process stages of a first experiment proving the feasibility of the first embodiment of the method of the invention. FIG. 4b shows a cross-section SEM picture of the device of FIG. 4a2.

In the step of FIG. 4a1 a substrate 10 is provided having a sacrificial oxide region 20 provided thereon. The sacrificial oxide region 20, here silicon oxide, is covered with a packaging cap layer 30 with release holes 35. A porous layer 40, here BD material, which is permeable to vapor HF etchant, is provided on the packaging cap layer 30 and in the release holes 35. In FIG. 4a2 the vapor HF etch (30 minutes at 35° C.) is carried out removing the sacrificial oxide region 20 and creating a cavity 50. The cross-section SEM picture of FIG. 4b shows clearly that all oxide in the cavity 50 is removed.

FIGS. 5a1 and 5a2 schematically show a sealing step carried out between further process stages of the first experiment proving the feasibility of the first embodiment of the method of the invention. FIG. 5b shows a cross-section SEM picture of the device of FIG. 5a2. FIG. 5a1 is the same as FIG. 4a2. FIG. 5a2 illustrates a further step of the experiment in which a seal layer (here silicon-germanium (SiGe)) is deposited on the porous layer 40. A schematic drawing of this experiment and a X-section SEM picture of the result is shown in FIG. 5. Clearly, there has been no deposition of the sealing layer 60 into the cavity 50.

FIGS. 6a1 and 6a2 schematically show an etching step carried out between two process stages of a first experiment proving the feasibility of the second embodiment of the method of the invention. FIGS. 6b to 6d show cross-section SEM pictures of devices in accordance with FIG. 6a2 for different porous layer thicknesses, 700 nm, 500 nm, and 300 nm, respectively. In FIG. 6a1 the porous layer 30 is directly used as packaging cap layer. The most important result of this second experiment is that even a 700 nm thick BD layer was porous enough to remove the sacrificial (oxide) layer 20 as is visible in FIG. 6b. The BD layer must be chosen thick enough to withstand the deposition of a sealing layer 60 (FIG. 5), which also depends on the sealing requirements.

FIGS. 7a to 7j show different stages in a method of manufacturing a semiconductor device in accordance with a third embodiment of the method of the invention.

Figure 7B:
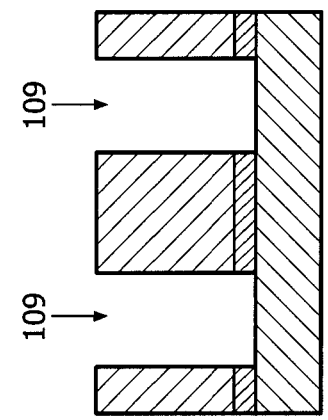
FIGS. 7a to 7j show different stages in a method of manufacturing a semiconductor device in accordance with a third embodiment of the method of the invention.
Figure 7D:
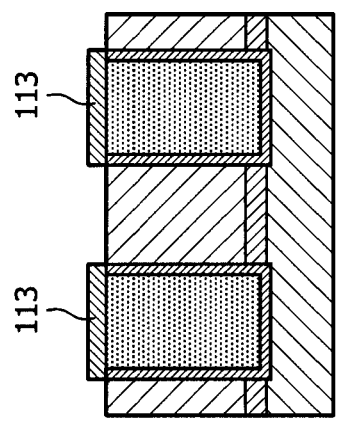
Figure 7A:
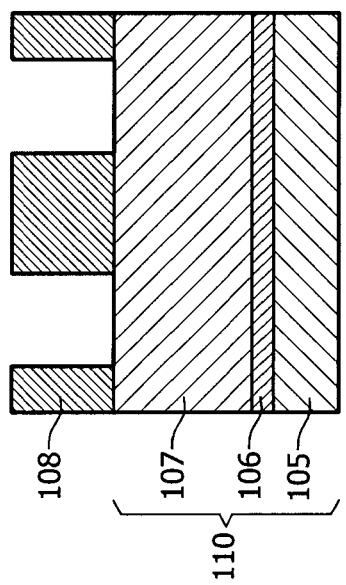

In the step of FIG. 7a a substrate 110 is provided comprising a semiconductor body 105. The semiconductor body 105 may comprise any one of the following semiconductor materials and compositions like silicon (Si), germanium (Ge), silicon germanium (SiGe), gallium-arsenide (GaAs) and other III-V compounds like indium-phosphide (InP), cadmium sulfide (CdS) and other II-VI compounds, or combinations of these materials and compositions. The semiconductor body may comprise active elements like transistors and diodes (not shown). These active elements together may form an electronic circuit (not shown). In any case, connection of the active elements is done via interconnect layers. These interconnect layers have parasitic capacitances which are defined by the dielectric constant of surrounding materials. The semiconductor body may even comprises contacts to lower layers (e.g. diffusion regions at the surface of an active region).

On the semiconductor body 105 a bottom barrier layer 106 is provided, and on the bottom barrier layer 106 an oxide layer 107 is provided, for example silicon oxide. A patterned masking layer 108 is provided on the oxide layer 107. The masking layer may be a hardmask or a photoresist layer, but here it is a photoresist layer. Masking is part of conventional lithography and well known to the person skilled in the art.

The pattern in the masking layer 108 defines the locations where the interconnecting wires will be formed.

In the step of FIG. 7b trenches 109 are etched in the oxide layer 107. Subsequently, the photoresist layer is stripped, and the bottom barrier layer 106 is opened such that the semiconductor body 105 having active elements is exposed.

Figure 7C:
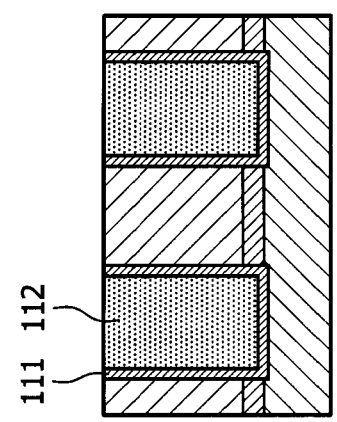

In the step of FIG. 7c first layer metallization is provided in the trenches 109. The metallization, i.e. interconnect lines, in this embodiment comprises copper, which may be provided as follows. First, a barrier layer is provided in the trenches. Then, a copper seed is layer is provided on the bottom of the trenches. Subsequently, bulk copper is deposited by copper electroplating, and finally a CMP step is performed.

In the step of FIG. 7d a passivation layer (self-aligned barrier) 113 is deposited on top of the copper interconnect lines by means of electroless barrier deposition. The barrier materials may comprise compositions like cobalt-tungsten-phosphor (CoWP), cobalt-tungsten-boron (CoWB). Alternatively, the passivation layer 113 may be provided using a combination of etching, deposition, and CMP, wherein the layer 113 comprises tantalum (Ta), titanium nitride (TiN), tantalum nitride (TaN), or combinations of those materials.

Figure 7G:
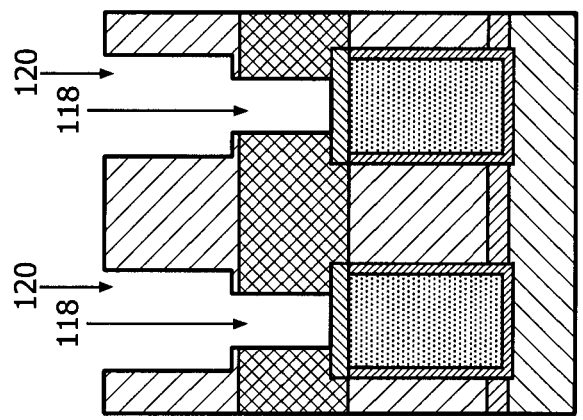
Figure 7F:
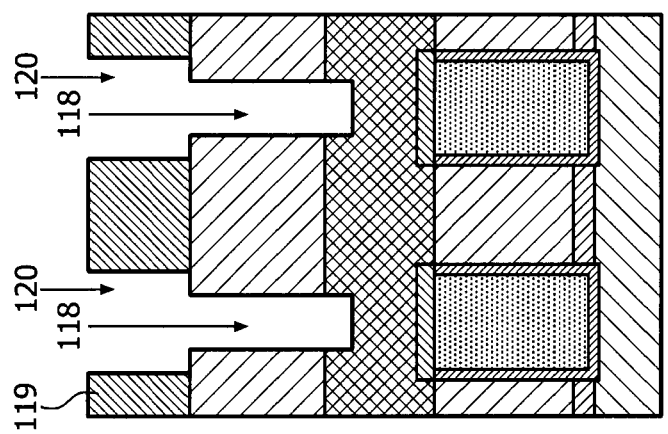
Figure 7E:
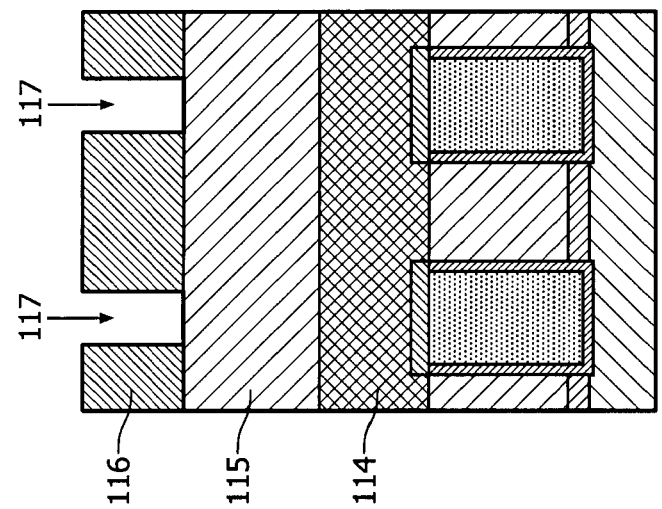

In the step of FIG. 7e a porous layer 114, in this example Black-Diamond™, is deposited using CVD processing on the structure. As already mentioned, no barrier layers or thin oxide layers are needed, and also no plasma treatment of the deposited Black-Diamond™ layer 114 should be done. Consequently, the porous layer 114 is permeable to vapor HF etchant, which a requirement of the invention, at least if further layers have to be deposited on the porous layer 114 as is the case in this process flow. In the step of FIG. 7e, also a further oxide layer 115 is provided on the porous layer 114. Subsequently, on the further oxide layer 115, a patterned via masking layer 116, here a photo resist layer, is provided, the photoresist layer 116 having small openings 117 for defining dimensions of the vias to be formed.

In the step of FIG. 7f, first, via openings 118 are etching using the patterned via masking layer 116 as a mask. The via openings 118 are etched to till approximately half way the full dielectric stack above the copper lines. Then, the photoresist layer 116 is stripped, and a patterned metallization masking layer 119, here a photoresist layer, is provided on the further oxide layer 115. The photoresist layer 119 has wider trenches 120 for defining dimensions of the interconnect lines to be formed in the second metallization layer.

In the step of FIG. 7g, a further etch step is performed using the patterned metallization masking layer 119 as a mask. By doing so the trenches 120 for the interconnect lines to be formed are deepened, and also the via openings 118 for the vias are deepened such that they extend to the capping layer 113 of the lower interconnect layer. Subsequently, the photoresist layer 119 is stripped followed by an optional cleaning step (e.g. using diluted HF and/or a sputter clean).

Figure 7J:
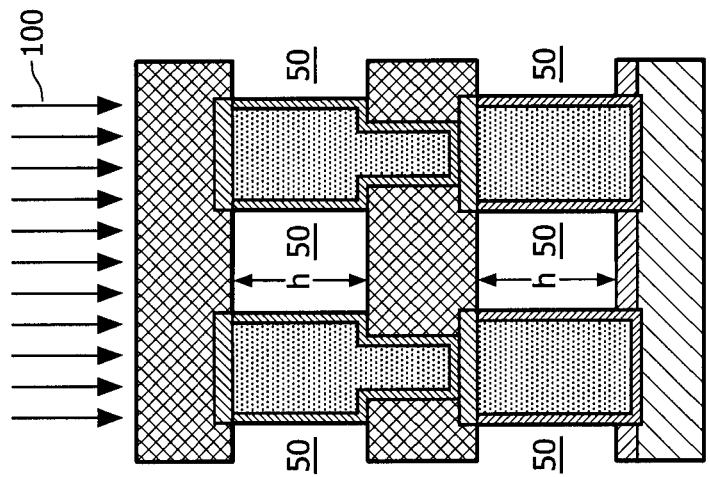
Figure 7I:
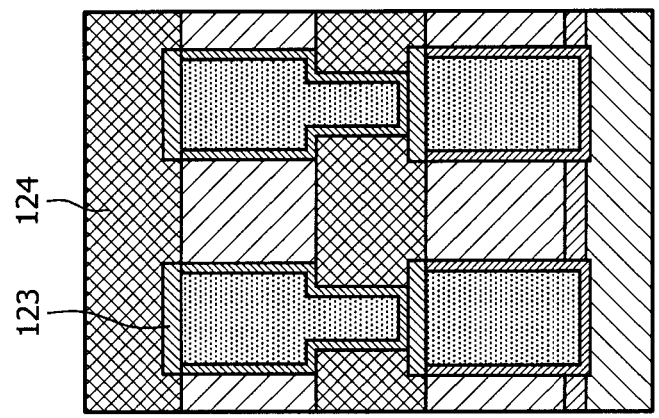
Figure 7H:
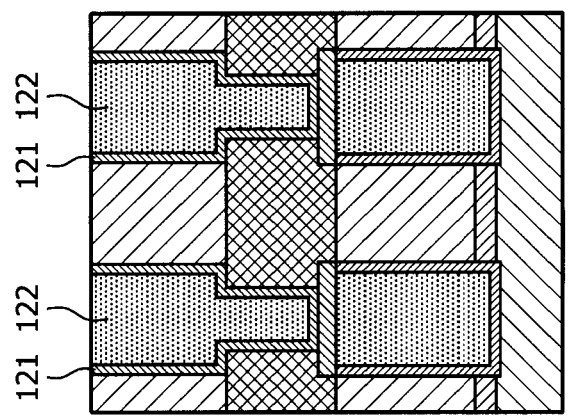

In the step of FIG. 7h second layer metallization is provided in the trenches 120 and the openings 118. The metallization, i.e. interconnect lines and vias, in this embodiment comprises copper, which may be provided as follows. First, a barrier layer is provided in the trenches and the openings. Then, a copper seed is layer is provided on the bottom of the trenches and openings. Subsequently, bulk copper is deposited by copper electroplating, and finally a CMP step is performed.

In the step of FIG. 7i a passivation layer (self-aligned barrier) 123 is deposited on top of the copper interconnect lines by means of electroless barrier deposition. The barrier materials may comprise compositions like cobalt-tungsten-phosphor (CoWP), cobalt-tungsten-boron (CoWB). Then, a further porous layer 124, in this example Black-Diamond™, is deposited using CVD processing on the further dielectric layer 115 and the copper lines 122. As already mentioned, no barrier layers or thin oxide layers are needed in the Black-Diamond™ layer 124, and also no plasma treatment of the deposited Black-Diamond™ layer 114 should be done. Consequently, the further porous layer 124 is permeable to vapor HF etchant, which is a requirement of the invention.

In the step of FIG. 7j a vapor HF etch step is performed using vapor HF etchant 100. In this etch step the vapor HF etchant 100 penetrates the permeable further porous layer 124, selectively removes the further oxide layer 115, penetrates the permeable porous layer 114, and selectively removed the oxide layer 115. This step leaves cavities 50 in both the first as well as the second interconnect layer at the trench level/intra-metal dielectric level. These cavities 50 are also called air-gaps in literature.

The method and device in accordance with the invention provide for another advantage over known methods and devices. In the method in accordance with the invention no hard-masks are required on top of the sacrificial layers 107, 115. Consequently, the height h of the air-gaps is larger. This leads to a reduced effective dielectric constant of the copper lines, which leads to lower parasitic capacitances.

In FIGS. 7a to 7j a method of manufacturing a semiconductor device with two interconnect layers. It must be noted, however, that any number of interconnect layers may be chosen. Such, modification only requires a repetition of process steps, before the step of vapor HF etching is done. In case of only a single interconnect layer it is no longer required not to densify the porous layer as the vapor HF etchant will remove the densified layer anyhow. In case of a plurality of interconnect layers this is different. When the lower interconnect layers have a thin densified layer at their surface, the vapor HF etchant will remove these layers, but this will make the layers in the metal stack loose from each other, which is also called delamination.

The description of FIGS. 7a to 7j showed the steps involved to make a Multi-Level (Dual) Damascene Copper Interconnect having Air Gaps at every trench level to reduce capacitance and thus RC-delay. The method of manufacturing a micro-device with a cavity in accordance with the invention is especially useful because the final air-gaps are made only after all relevant BEOL processing steps have been done. This ensures not only RC-delay reduction, but also ensures optimal structural stability trough-out the entire Multi-Level Interconnect processing which can include up to more than 10 levels in future IC's.

It must be noted that in the process flow as illustrated in FIGS. 7a to 7j the number of Air Gap levels can be chosen according to the needs of the designer. Only there where sacrificial oxide is deposited an air-gap will be formed. In other words, the capacitance reduction may be tuned at desired metal levels and via levels.

It must be stressed that the method as illustrated in FIGS. 7a to 7j are just an example embodiment. In back-end-of-line processes of deep-submicron technologies many variations exist. For example, aluminum interconnect versus copper interconnect, single damascene copper versus dual damascene copper, various types of barriers layers or no barrier layer, capping layers or no capping layers, various types of dielectrics, and so on. It must be noted that these variations do not affect the applicability of the method of the invention. Where an air-gap is desired a sacrificial oxide 20 layer may be deposited and covered by a porous layer 40 that is permeable to vapor HF etchant 100. As long as there is "path" from the top surface of the device through porous layers 40, air-gaps 50 to the air-gaps in the lowest interconnect layer, the method in accordance with the invention may be applied. If the sacrificial oxide regions in all air-gaps are selected such that they are removed by vapor HF-etchant, then all air-gaps will be created in the same etchant step.

The invention may be applied in a wide variety of application areas. By way of a first example illustrated in this description, it may be applied in the manufacturing of air-gaps in the interconnect layers of a semiconductor device, and, by way of a second example illustrated in this description, in the manufacture of a MEMS device, and in particular in the encapsulation stage thereof. Nevertheless, the method may be applied in various other application areas. In those application areas, the inventive concept is the same, namely the forming of a cavity by selectively etching a sacrificial oxide region through a porous layer that is permeable to vapor HF etchant.

The description so far did not go into detail about the various types of MEMS device which may be encapsulated using the method of the invention. The method is broadly applicable to various types of micro-device, including MEMS devices. The only requirement for MEMS device is that the MEMS device comprises a moveable component which is located in a cavity. In one embodiment of the micro-device in accordance with the invention the MEMS device is a MEMS resonator. In such device the moveable component is a membrane which is mechanically coupled to a substrate with so-called anchors and which may be brought into resonating mode by means of, for example, electrostatic forces. A MEMS resonator may be applied in various application areas, for example it may be used to substitute crystal oscillators (XO's) for timing reference purposes. Also, they may form part of phase-locked loops. Phase-locked loops may be used in high-frequency clock generators.

Various variations of the method and micro-device in accordance with the invention are possible and do not depart from the scope of the invention as claimed. These variations for example relate to the manufacturing of other micro-devices which have not been explicitly mentioned in this description. Also, in the method of manufacturing a micro-device in accordance with an embodiment of the method of the invention, many alterations are possible. Such alterations fall within the normal routine of the person skilled in the art and do not deviate from the inventive concept here disclosed.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage. Throughout the Figures, similar or corresponding features are indicated by same reference numerals or labels.

The invention claimed is:

1. A micro-device, comprising a substrate with a cavity, wherein the cavity is covered with a patterned cap layer, the patterned cap layer being covered with a porous layer that is permeable to vapor hydrofluoric acid (HF) etchant, wherein a top surface of the porous layer is at a first level over features of the patterned cap layer and at a second level between the features, the second level being different than the first level, wherein the micro-device comprises a Microelectromechanical Systems (MEMS) device with a component that is moveable in operational use of the MEMS device, wherein the component is arranged within the cavity, wherein the porous layer comprises a non-densified carbon doped oxide.

2. The micro-device of claim 1, further comprising a release hole extending to the cavity through the cap layer, wherein the porous layer is provided on the cap layer and in the release hole.

3. The micro-device of claim 1, further comprising a sealing layer deposited over the porous layer.

4. The micro-device of claim 1, wherein the cavity comprises an air gap in a sacrificial oxide region.

5. The micro-device of claim 4, wherein the sacrificial oxide region comprises silicon oxide.

6. The micro-device of claim 1, wherein the porous layer has a thickness less than 700 nm.

7. A micro-device comprising:
   a substrate comprising an element that is moveable in operational use of a Microelectromechanical Systems (MEMS) device, the element being positioned within a cavity;
   a packaging cap layer including a hole aligned with the cavity; and
   a porous layer comprising a porous material, the porous layer covering the cavity such that a top surface of the porous layer is at a first level within the hole and a different level over the packaging cap layer, the porous material being permeable to a vapor hydrofluoric acid (HF) etchant;
   wherein the porous layer comprises a non-densified carbon doped oxide.

8. The device of claim 7, further comprising a release hole in the packaging cap layer over the porous layer.

9. The device of claim 8, wherein the packaging cap layer includes the release hole directly above the element.

10. The device of claim 8, further comprising, a sealing layer over the porous layer.

11. The device of claim 8, wherein the porous layer has a thickness less than 700 nm.

12. The device of claim 8, wherein the cavity comprises an air gap in a sacrificial oxide region.

13. A micro-device comprising:
    a substrate;
    a first interconnect layer;
    a first porous layer being permeable to a vapor hydrofluoric acid (HF) etchant, the porous layer being disposed over the first interconnect layer, the first interconnect layer and the first porous layer define a first cavity;
    a second interconnect layer disposed over the first interconnect layer;
    a second porous layer disposed over the second interconnect layer, wherein the second porous layer is permeable to a vapor HF etchant, the second interconnect layer and the second porous layer defining a second cavity wherein the first and second porous layers comprise a non-densified carbon-doped oxide; and a Microelectromechanical System (MEMS) device disposed within the first and second cavities.

14. The device of claim 13, further comprising, a sealing layer over the first porous layer.

15. The device of claim 13, wherein the first porous layer has a thickness less than 700 nm.

16. The device of claim 13, wherein the first cavity comprises an air gap in a sacrificial oxide region.

17. The device of claim 13, further comprising a patterned packaging cap layer with a release hole extending to the cavity.

18. The device of claim 17, wherein the porous layer is provided on the packaging cap layer and in the release hole.

19. The device of claim 13, wherein the micro-device does not include a packaging cap layer between the porous layer and the cavity.

* * * * *